(12) United States Patent
Maret et al.

(10) Patent No.: US 11,614,467 B2
(45) Date of Patent: Mar. 28, 2023

(54) FAIL-SAFE RETROFITTING KIT FOR A PARTIAL DISCHARGE MONITORING SYSTEM AND A PREINSTALLED VOLTAGE INDICATION SYSTEM (VIS)

(71) Applicant: ABB Schweiz AG, Baden (CH)

(72) Inventors: Yannick Maret, Dättwil (CH); Kai Hencken, Lörrach (DE)

(73) Assignee: ABB SCHWEIZ AG, Baden (CH)

( * ) Notice: Subject to any disclaimer, the term of this patent is extended or adjusted under 35 U.S.C. 154(b) by 874 days.

(21) Appl. No.: 16/458,946

(22) Filed: Jul. 1, 2019

(65) Prior Publication Data

US 2020/0003804 A1    Jan. 2, 2020

(30) Foreign Application Priority Data

Jun. 29, 2018   (EP) .................................. 18180871

(51) Int. Cl.
*G01R 1/36* (2006.01)
*G01R 21/133* (2006.01)
(Continued)

(52) U.S. Cl.
CPC .............. *G01R 1/36* (2013.01); *G01R 21/133* (2013.01); *G01R 22/063* (2013.01); *H02J 13/00009* (2020.01)

(58) Field of Classification Search
CPC ...... G01R 1/36; G01R 21/133; G01R 22/063; G01R 31/1227; H02J 13/00009; Y02E 60/00; Y02E 60/7815; Y04S 40/121
(Continued)

(56) References Cited

U.S. PATENT DOCUMENTS

| 4,779,051 A | 10/1988 | Grünewald et al. |
| 10,013,658 B2 * | 7/2018 | Streichert .............. G06N 20/00 |

(Continued)

FOREIGN PATENT DOCUMENTS

| CN | 107179483 A | 9/2017 |
| DE | 10304396 A1 | 7/2004 |
| DE | 202010016782 U1 | 5/2011 |

OTHER PUBLICATIONS

European Patent Office, Extended Search Report issued in corresponding Application No. 18180871.8, dated Dec. 21, 2018, 11 pp.

*Primary Examiner* — Giovanni Astacio-Oquendo
(74) *Attorney, Agent, or Firm* — Greenberg Traurig, LLP

(57) ABSTRACT

A fail-safe device is disclosed for ensuring compatibility and reliable operation of a Voltage Indicator System (VIS) for a medium- or high-voltage apparatus in presence of a monitoring system with: a first and second fail-safe device terminal; the first terminal being connectable to an output terminal of a coupler, the coupler being provided in a medium- or high voltage portion of the apparatus, and the second terminal being connectable to an input terminal of the VIS, which is provided in the low-voltage portion; a third and fourth fail-safe device terminal, wherein the third and fourth terminals being electrically connectable to first and second input/output terminals of the monitoring system; and an electrical circuit connecting the first and second fail-safe device terminal and being adapted to compensate for electrical failure modes of the monitoring system such, that the VIS is operable in case the electrical failure modes occur.

19 Claims, 7 Drawing Sheets

(51) Int. Cl.
*G01R 22/06* (2006.01)
*H02J 13/00* (2006.01)

(58) Field of Classification Search
USPC .................................... 324/119, 76.11, 73.1
See application file for complete search history.

(56) References Cited

U.S. PATENT DOCUMENTS

| | | | |
|---|---|---|---|
| 11,125,802 B2 * | 9/2021 | Winkelmann | G01R 31/14 |
| 2009/0064403 A1 * | 3/2009 | Wolfe | G08B 21/082 |
| | | | 4/504 |
| 2009/0145674 A1 * | 6/2009 | Lee | B60L 50/16 |
| | | | 333/182 |
| 2010/0241330 A1 * | 9/2010 | Hartmann | B60T 8/344 |
| | | | 701/70 |
| 2011/0019447 A1 * | 1/2011 | Olsen | H02K 47/04 |
| | | | 363/102 |
| 2015/0073733 A1 * | 3/2015 | Agapiou | G01R 31/343 |
| | | | 702/58 |
| 2016/0054364 A1 * | 2/2016 | Chen | G01R 31/62 |
| | | | 324/547 |
| 2017/0205449 A1 * | 7/2017 | Kao | G01R 31/50 |
| 2017/0329319 A1 * | 11/2017 | Kopp | G01R 1/36 |
| 2022/0260636 A1 * | 8/2022 | Kries | G01R 19/16576 |

* cited by examiner (a) basic principle; (b) alternative embodiments.

(a) basic principle; (b) example of embodiment;

FAIL-SAFE RETROFITTING KIT FOR A PARTIAL DISCHARGE MONITORING SYSTEM AND A PREINSTALLED VOLTAGE INDICATION SYSTEM (VIS)

FIELD OF INVENTION

Embodiments of the present disclosure generally relate to monitoring a dielectric strength of a high-voltage installation, especially in a Medium and/or High Voltage area, with specific monitoring systems.

In particular, embodiments of the present disclosure relate to devices and methods that allow retrofitting monitoring systems, in particular partial discharge monitoring systems, on medium-voltage or high-voltage installations, using existing, pre-installed voltage indication systems. In particular, a retrofit device may further allow failure handling in the partial discharge monitoring system in view of the pre-installed voltage indication system.

BACKGROUND OF INVENTION

Partial Discharges (PD) are characterized in that they appear as short events, in the range of nanoseconds and are a stochastically recurring discharge event, located in the medium- or high-voltage part of an installation. Partial discharge can be measured by looking at the effect of flowing charges during the event. This flow results in temporary voltage changes on the high-voltage conductor. Partial Discharges (PD) in medium-voltage equipment can be linked to 25% of the failures, therefore it is of interest to monitor partial discharges.

A medium- or high voltage installation has, e.g. on switchgears, installations to visualize, whether the installation is under high-voltage. These installations are referred to as Voltage Indicator System (VIS), which signalize the presence of high-voltage in the installation. In an existing high or medium voltage installation, voltage indication systems are arranged in a low voltage area or compartment of the medium or high voltage installation. A Voltage indication systems may serve as a security function for e.g. maintenance personnel.

A voltage indication system visualizes an existing dangerous voltage in the system and is generally meant as a voltage measurement system, providing a coupling (preferably capacitive coupling) to a high-voltage conductor, for example, but not limited to, a voltage detection system or voltage presence indication system or similar. It is referred to this collectively as voltage indication system or VIS in the rest of the document. The voltage indication system, as well as the partial discharge measurement system, may also be based on a capacitive coupling to high-voltage. It could be considered as an advantage, if an online partial discharge measurement system could simply be combined with an existing (brownfield) voltage indication system.

The voltage indication system is therefore an important safety device in a medium or high-voltage installation. The voltage indicator system has electrical connections leading into the medium or high-voltage compartment, which may be used, in case an additional monitoring system, in particular an online partial discharge monitoring system, shall be installed.

Retrofitting an online monitoring system, in particular partial discharge monitoring system, using an existing, pre-installed VIS system, would therefore have the advantage that an access to the high-voltage compartment is not required, since the high-voltage coupler and the cable installation already used for the pre-installed VIS may be reused. It is not necessary to install an additional coupler used by the monitoring system. This means a lower hardware cost and less installation effort. Additionally, the installation of an online monitoring system could in principle be done without shutting down the high-voltage.

However, certain failures of a retrofitted PD monitoring system may result in a failure of the Voltage Indicator System, which is not acceptable. A Voltage-Indicator-System acts as a safety device for e.g. maintenance personnel. It shall visualize to the maintenance personnel that the system is under high voltage. Additionally, installing and especially replacing the PD monitoring system requires shutting down the high voltage system completely, which is as well often undesirable.

It is therefore desirable, to provide solutions, which allow a simpler installation of a partial discharge monitoring system to an existing pre-installed Voltage-Indicator-System (VIS), without shutting down the power plant or a respective part of the power plant. Moreover, a provided solution shall have a certain safety function, which allows a proper functionality of the Voltage-Indicator-System in case the partial discharge monitoring system fails.

SUMMARY OF INVENTION

In a first aspect and in order to address the foregoing and other potential problems, embodiments of the present disclosure propose a fail-safe device or kit for retrofitting a monitoring system and ensuring a reliable operation of a Voltage-Indicator-System, VIS for a medium- or high voltage apparatus in presence of a monitoring system, in particular an online partial discharge monitoring system.

The fail-safe device comprising: a first fail-safe device terminal and a second fail-safe device terminal; the first fail-safe device terminal adapted to be connected to an output terminal of a coupler, the coupler may be provided in a medium- or high voltage portion of the medium- or high-voltage apparatus, and the second fail-safe device terminal adapted to be connected to an input terminal of the Voltage-Indicator-System, VIS, which is provided in the low-voltage portion; a third fail-safe device terminal and a fourth fail-safe device terminal, wherein the third and fourth fail-safe device terminals are adapted to be electrically connected to first and second input/output terminals of the monitoring system; an electrical circuit, connecting the first fail-safe device terminal and the second fail-safe device terminal and adapted to compensate for electrical failure modes of the monitoring system such, that the VIS is operable in case the electrical failure modes occur.

In a further aspect, a monitoring system with a fail-safe device according to one or more embodiments is disclosed, wherein the fail-safe device is electrically connected with the monitoring system and monitoring system is electrically connected with a Voltage-Indicator-System.

In another aspect, a Voltage-Indicator-System, VIS, with a fail-safe-device according to aspects of the present application is disclosed.

In another aspect, a Voltage-Indicator-System with a monitoring system is disclosed, wherein the monitoring system concerns aspects of the present application.

BRIEF DESCRIPTION OF DRAWINGS

Embodiments of the present disclosure will be presented in the sense of examples and their advantages are explained in greater detail below, with reference to the accompanying drawings, wherein.

DETAILED DESCRIPTION OF EMBODIMENTS

Figure 1:
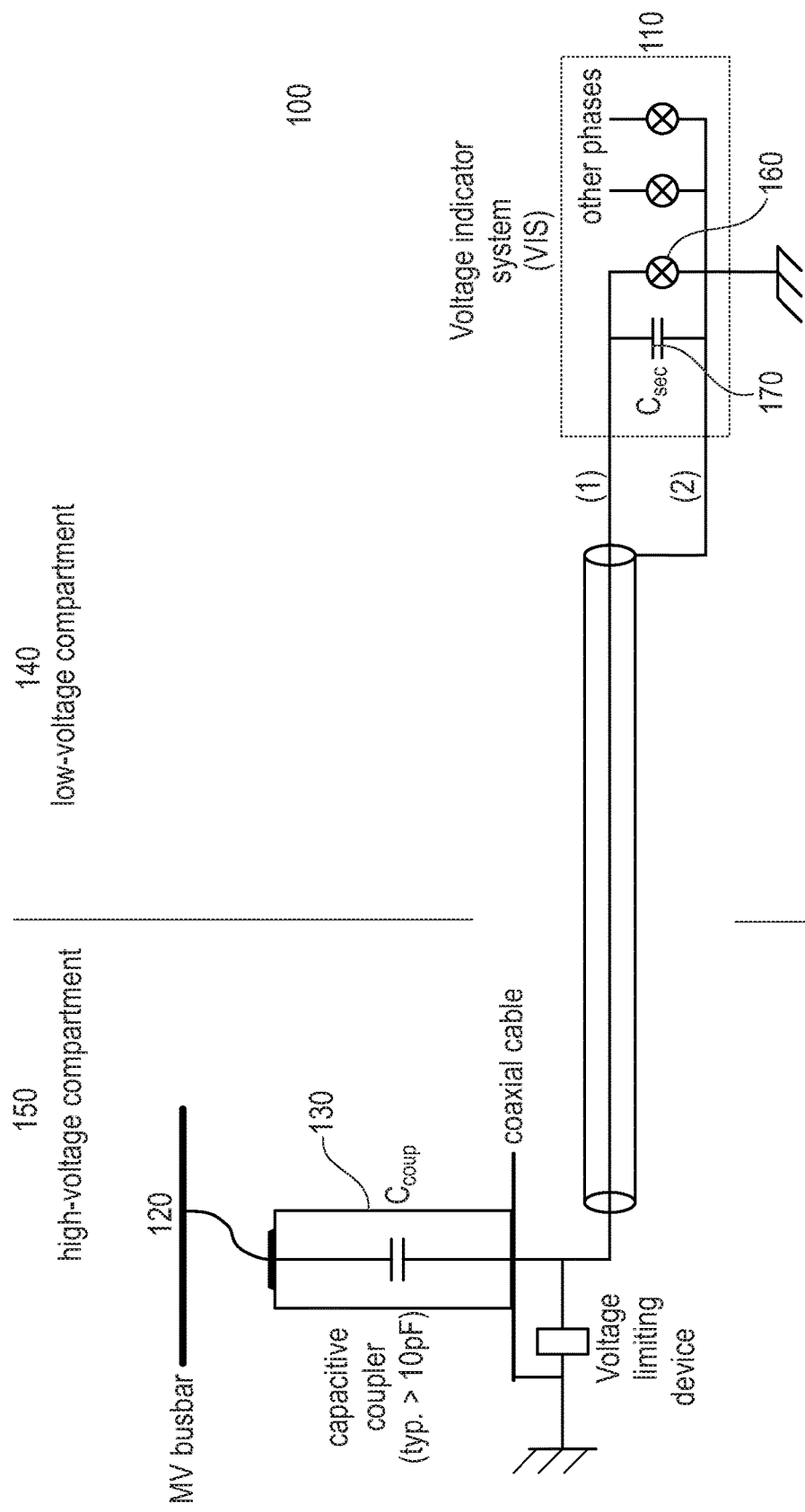
FIG. 1 is a VIS setup as used in prior art systems.

Hereinafter, the principle and spirit of the present disclosure will be described with reference to the illustrative embodiments. It should be understood, all these embodiments are given merely for the person skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e. a definition that is different from the ordinary and customary meaning as understood by those skilled in the art, is intended to be implied by consistent usage of the term or phrase herein. To the extent that a term or phrase is intended to have a special meaning, i.e. a meaning other than that understood by skilled artisans, such a special definition will be expressly set forth in the specification in a definitional manner that directly and unequivocally provides the special definition for the term or phrase. Same items are designated with same reference signs throughout description claims and drawings.

The proposed disclosure provides retrofitting of an online monitoring system to an existing switchgear installation, wherein the switchgear installation is already equipped with a Voltage-Indicator-System (VIS). By reusing the already installed Voltage Indicator system (VIS), the provided solution is a low-cost solution.

An installation kit is provided, which enables easy retrofit of a partial discharge monitoring system to an existing Voltage-Indicator-System, while keeping the functionality of the latter. A failure of the partial discharge monitoring system may not lead to malfunctions of the Voltage-Indicator-System. The installation kit may allow for a hot swap of the partial discharge monitoring system (e.g. to upgrade of the latter or replace a faulty unit).

Therefore, in a first aspect, a fail-safe device or a fail-safe kit, for ensuring reliable operation of a Voltage Indicator system 110, VIS for a medium-voltage or high voltage apparatus in presence of a monitoring system 210 may be disclosed. In general, reliable operation means that a Voltage Indicator System, a monitoring system, in particular a partial discharge monitoring system 210 and a failsafe kit or device as provided are construed such that they do not interfere with one another. In other words, a mutual compatibility and/or robustness should be assured. The function of indicating a voltage in the system and the function of determining partial discharges in the system should preferably be available with no restrictions. However, it may be assured, that a Voltage-Indicator-System works correctly even if a monitoring system, e.g. a partial discharge monitoring system, fails, since the Voltage-Indicator-System provides a safety function.

The monitoring system can in particular be a pulse monitoring system for monitoring effects triggered by electrical pulses like e.g. electrical break-through. Therefore, the monitoring system advantageously may relate to a partial discharge monitoring system that can monitor and determine pulses and their effects coming e.g. from discharge events in insulation materials.

Figure 3:
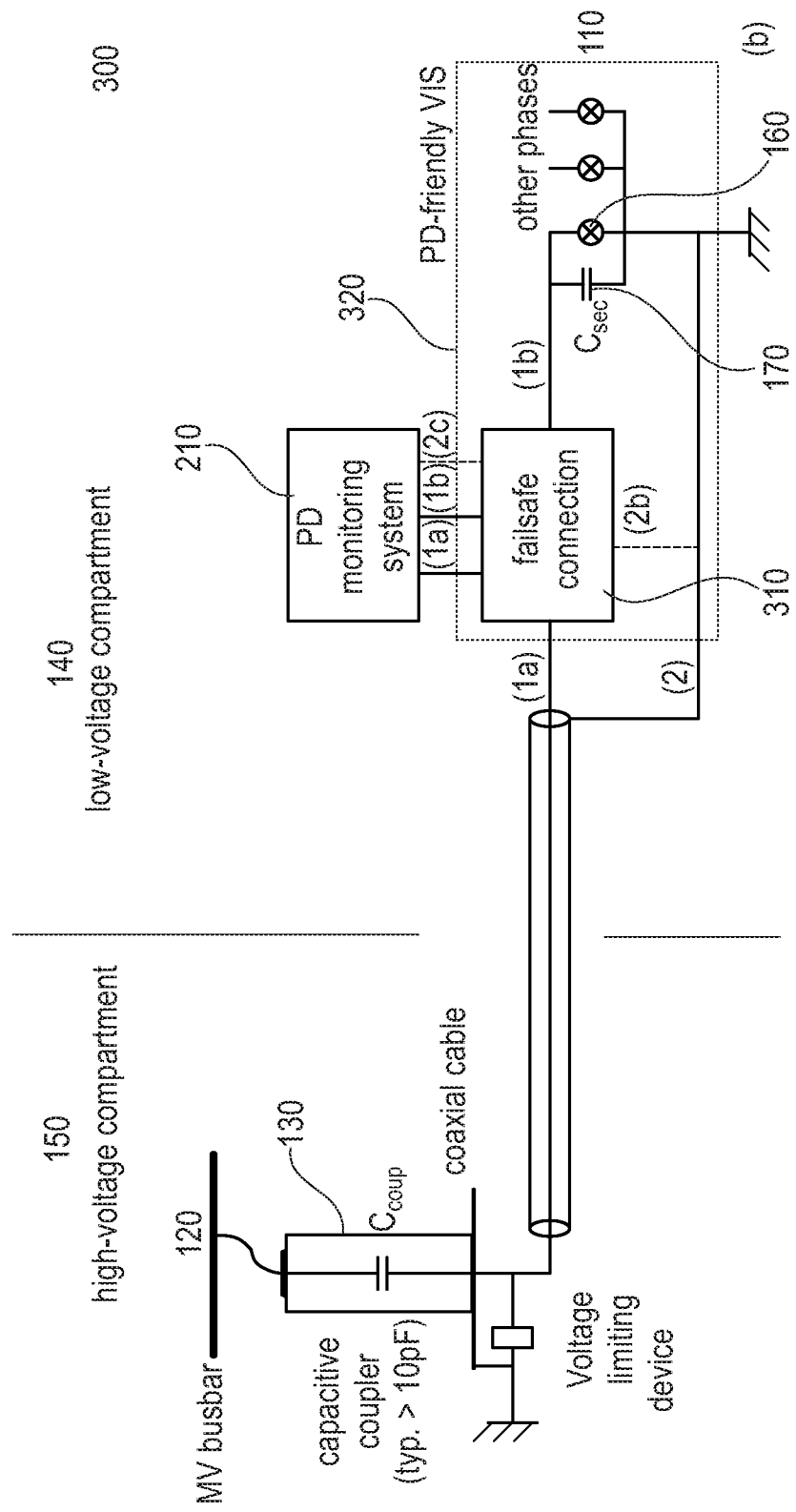
FIG. 3 shows an embodiment of a solution of the present application.

The fail-safe device or fail-safe-kit 310 may comprise, see FIG. 3: a first fail-safe device terminal (1a) and a second fail-safe device terminal (1b); the first fail-safe device terminal (1a) may be adapted to be electrically connected to an output terminal of a coupler 130 via a coaxial cable, which is provided between the coupler 130 and the failsafe device terminal (1a). The coaxial cable is not specifically designated with an own reference sign.

Coupler 130 may be provided in a medium- or high-voltage portion 150 of the medium- or high-voltage apparatus. The second fail-safe device terminal (1b) may be adapted to be connected to an input terminal of the Voltage Indicator System, VIS 110, which may be provided in the low-voltage portion or low-voltage compartment 140.

A third fail-safe device terminal (1a) and a fourth fail-safe device terminal (1b) may be provided, wherein the third and fourth fail-safe device terminals may be adapted to be electrically connected to first and second input/output terminals of the partial discharge monitoring system 210 and an electrical circuit 310, which may connect the first fail-safe device terminal (1a), coming from coaxial cable and the second fail-safe device terminal, connecting to the Voltage-Indicator-System 110. The electrical circuit 310, which can be a fail-safe kit or device, may be adapted to compensate for electrical failure modes of the monitoring system 210 such, that the VIS 110 may remain operable in case the electrical failure modes occur.

A prior-art Voltage-Indication-System setup is shown in FIG. 1. A high-voltage (capacitive) coupler 130 is electrically connected to busbar 120 in high-voltage compartment 150. The capacitive coupler 130 is connected to the Voltage-Indication-System 110 via a cable, preferably a coaxial cable. A first part of the coaxial cable may be arranged in the high-voltage compartment 150, the second part of the coaxial cable may be arranged in the low-voltage compartment 140. Signal wire (1) and shield (2) of the coaxial cable are connected to Voltage-Indication-System 110. The Voltage-Indication-System may also contain a secondary impedance 170, in form of a capacitor $C_{sec}$, which, together with the coupler impedance 130, in form of a capacitor $C_{coup}$, forms a voltage divider. A lamp 160 (either a discharge lamp or LED) is connected across the secondary impedance $C_{sec}$ and lights up, when the voltage on the busbar 120 is above a certain level.

Retrofitting an online partial discharge monitoring system to an installation using an existing Voltage-Indication-System 110 system as shown in FIG. 1, has the advantage that no access to high-voltage compartment 150 is required, since high-voltage coupler 130 and voltage indication system 110 are re-used. An additional coupler for connecting the monitoring system 210 need not be installed.

This advantageously means lower hardware cost and less installation effort. Additionally, a shutdown of a power plant may not be required. The VIS 110 and partial discharge monitoring system 210 should be mutually "transparent", such that the VIS 110 is not influenced negatively by the partial discharge monitoring system 210 and vice versa. Additionally, the partial discharge monitoring system 210 is configured to be commissioned and replaced simply in case of failure or upgrade from the partial discharge monitoring side. For example, the monitoring system 210 may have electrical connections in form of a harness or connectors assembly.

Figure 2:
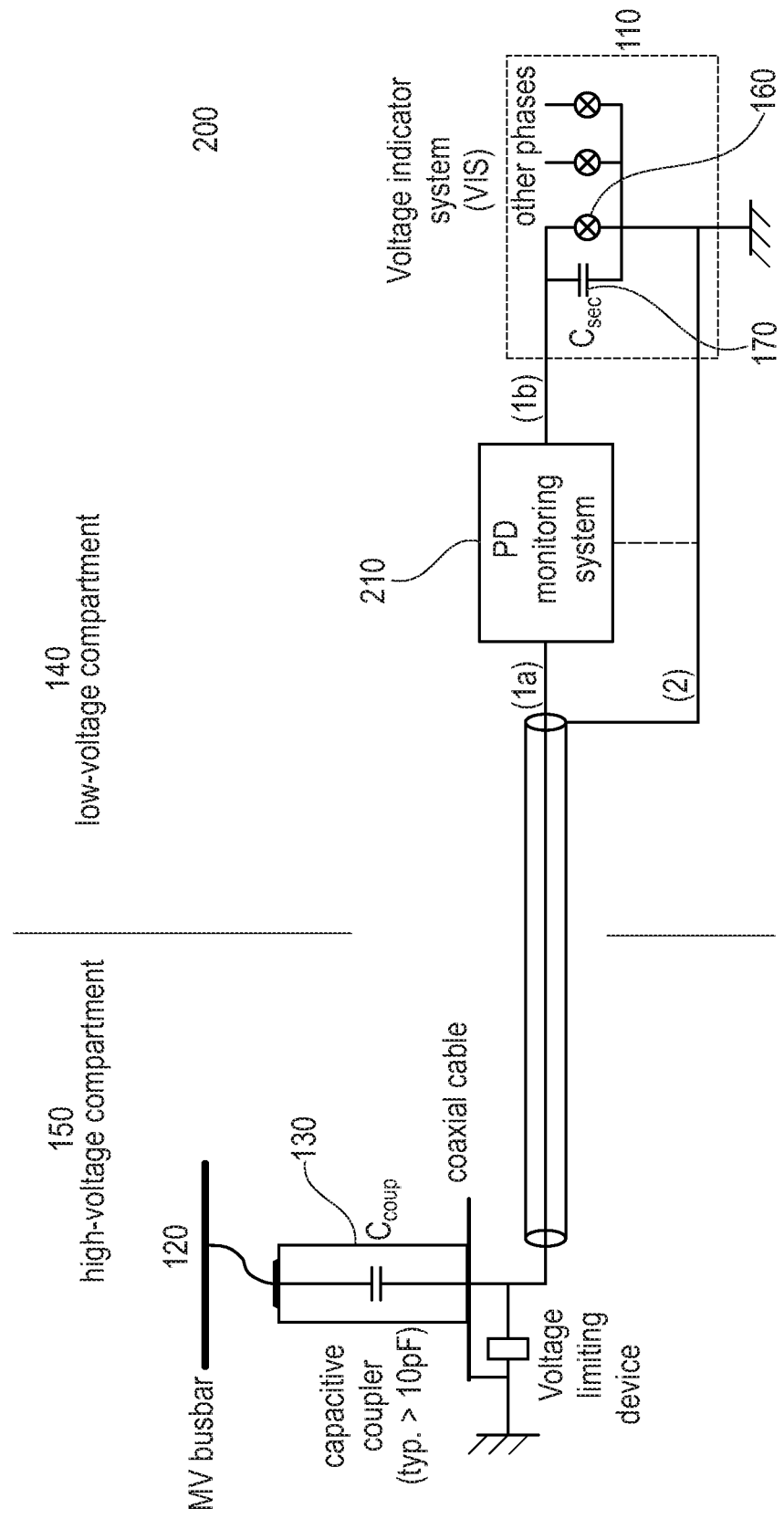
FIG. 2 is illustrates a connection of a partial discharge monitoring system with a VIS, according to embodiments of the present application.

The connection of a monitoring system 210, in particular a partial discharge monitoring system to a brownfield Voltage-Indication-System 110 is illustrated in FIG. 2. It consists of the implementation of an electrical circuit, which represents the monitoring system 210, between the Voltage-Indication-System 110 and the coupler 130, or more precisely, in wire connection (1) which connects coupler 130 and Voltage-Indicator-System 110. A connection to ground may be as well needed.

Drawbacks of the setup as shown in FIG. 2 are, that certain kinds of failure (failure modes) of the monitoring system 210 may result in a failure or false visualization of the Voltage-Indication-System 110. This is not acceptable, since the Voltage-Indication-System acts as a safety device for maintenance personnel. Additionally, installing and replacing the partial discharge monitoring system would require shutting down the high-voltage system completely, which is a huge drawback.

Likely failures or failure modes which can occur, may be, e.g., an open circuit between said first and second fail-safe device terminals (1a) and (1b) or, as another failure mode, a short circuit between the monitoring system and a ground potential. The failsafe device in a fail-safe kit protects against two types of failures of the partial discharge monitoring system.

In the first failure mode, namely the open circuit failure mode, the partial discharge monitoring system fails and leaves the connection (1a)-(1b) open, whereas, in the second failure mode, the partial discharge monitoring system fails and connects permanently connections (1), (1a) or (1b) to connection (2), which is called a "short" or in this case, a "short to ground". In both modes, the Voltage-Indication-System 110 would not indicate the presence of high voltage.

The failure mode according to open-circuit is avoided by providing an additional secondary signal path from connection (1a) to (1b), wherein this additional signal path lies within the failsafe connection kit this additional signal path should fulfil two requirements: first requirement is that the signal path is not prone to failure, which means that this connection may be stable and uninterruptible in the highest possible way. As a second requirement, the additional connection shall not disturb a measurement performed by the monitoring system in particularly partial discharge monitoring system 210.

The monitoring system 210 can create small voltage drop over a series impedance in the connection to the VIS 110 to have a voltage signal for measuring. Alternatively, the monitoring system 210 can also directly measure the current flowing in the connection to the VIS 110 in possibly a contactless fashion (e.g. HF transformer, Hall sensors, etc.). In both case, the voltage drop or loss created by the monitoring system 210 is in the range of a few hundred millivolts maximum. By contrast, the voltage drop across the Voltage-Indicator-System 110 is in the tens or hundreds of volts, as it needs this high voltage for, at least in case of glow lamps, to ignite the lamps.

A possible solution to avoid an open circuit failure mode is to place one or more semiconductors which may be adapted to electrically connect the first fail-safe device terminal (1a) and the second fail-safe device terminal (1b), to ensure a current flowing between the first fail-safe device terminal (1a) and the second fail-safe device terminal (1b) in case the monitoring system 210 is in an open-circuit condition or not built-in, e.g. is removed due to maintenance.

In particular, the semiconductors may consist of diodes. To assure a current flowing in both directions, at least two diodes can be used, which may be connected back-to-back between connection points (1a) and (1b) in the path to the Voltage-Indicator-System 110, see FIG. 5a. This diode arrangement forms the additional (or secondary) signal path and may ensure, that the Voltage-Indicator-System 110 is functional, even if the partial discharge monitoring system 210 fails and turns into an open circuit. The diode arrangement works, even if the partial discharge system 210 is removed. A signal path from coupler 130 to Voltage-Indicator-System 110 is maintained.

A small voltage loss (typically 500 mV to 1 V for silicon diodes) is created across the diodes. But this voltage drop is negligible with respect to the voltage measurable over Voltage-Indicator-System 110 and has no influence on the functionality of the Voltage Indication System 110. On the other hand, diodes are (ideally) not conducting below their conduction threshold. The diodes are then "invisible" and may not disturb the function of the monitoring system 210, if it produces a voltage drop between (1a) and (1b) less than the threshold for typical partial discharge value.

The semiconductor arrangement may comprise at least a Zener-Diode. By adding more Zener-Diodes in series as shown in FIG. 5b, a conduction threshold can be increased. According to FIG. 5a, generally more than two diodes are possible. The diodes may be switched antiparallel, back-to-back, or in a combination thereof, see FIG. 5a. When adding more diodes to increase the threshold voltage, it may be assured, that the measurement requirements for the Voltage Indicator System is still fulfilled. That is to say, that the voltage for the VIS is high enough that glow lamps 160 ignite.

The proposed diode-based circuit 520, 530, 540 can be improved in its robustness e.g. by over-dimensioning the diodes in terms of supported current. The limitation of the voltage level can also be seen as a protection to the partial discharge measurement system 210, e.g. in the case of unexpected high voltage level.

Figure 5:
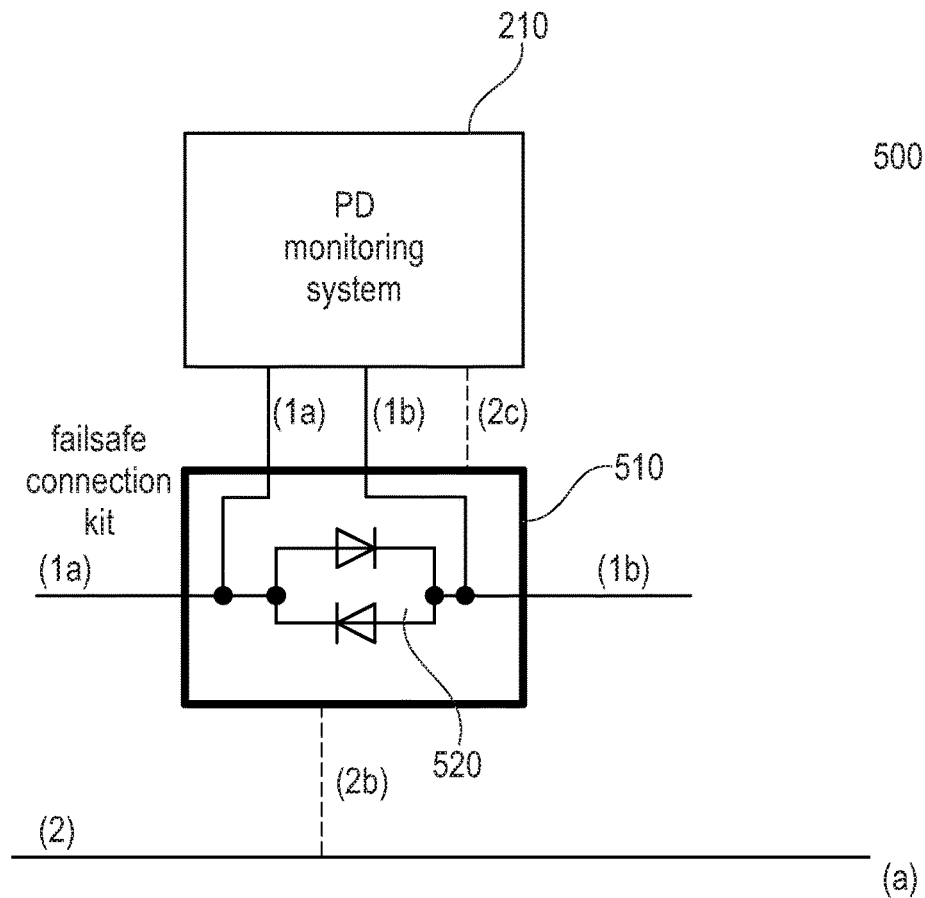
FIG. 5 shows embodiments of circuits in fail-safe devices according to embodiments of the present disclosure.
Figure 5:
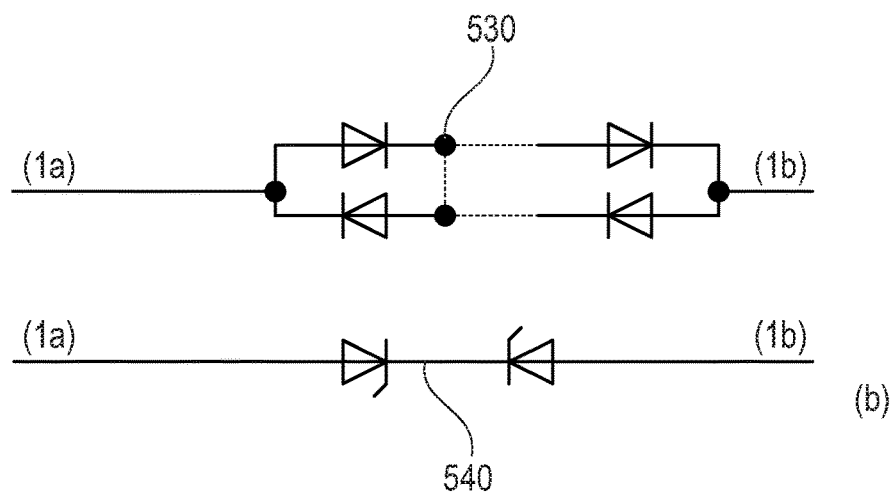

An electrical connection between the first fail-safe device terminal (1a) and the second fail-safe device terminal (1b), in form of the electrical circuit 510 is configured such, that the monitoring system 210 may measure a partial discharge in a voltage drop over the electrical connection. FIG. 5 (a) shows that connections (1a), (1b) and optional (2) may lead from the failsafe connection kit to the monitoring system 210. A property, in particular in a different frequency range than a line frequency, can be measured as a voltage drop over the electrical connection. This property may be, for example, an electrical discharge pulse, which is contained in the voltage drop, measured across the connection points (1a) and (1b). In particular, the measured voltage drop, may contain properties of the measured electrical discharge pulse in a high frequency range.

In a further aspect, the electrical connection which is provided by the electrical circuit, may comprise a wire connection. The wire connection may electrically connect the first fail-safe device terminal and the second fail-safe device terminal, to ensure that a current can flow between the first fail-safe device terminal and the second fail-safe device terminal in case the monitoring system 210 is in an open-circuit condition. The wire connection may also electrically connect the first fail-safe device terminal (1a) and the second fail-safe device terminal (1b), to ensure that a current can flow between the first fail-safe device terminal and the second fail-safe device terminal in case of absence of the monitoring system 210. Over a wire, a voltage drop cannot be measured since the resistance of a single wire might be too small, to generate a sufficient voltage drop together with the small current, flowing through the connection circuit. However, even a small current flowing through this wire or connection may produce a magnetic field. This magnetic field can be measured with a sensor where the sensor produces a measuring voltage. Since the magnetic field may contain the same information as the voltage drop would contain, this information is also contained in the measuring voltage. A sensor (not shown in the figures), which may be susceptible to magnetic fields may be e.g. a High-frequency current transformer, a Rogowski-coil and any other magnetically susceptible sensor which is fast enough to determine discharge pulses in the magnetic field surrounding the wire (1).

In an alternative embodiment, the electrical connection can comprise a resistor and/or an inductor (coil). The coil can be with or without a core. Electrical values (component values) of the resistor or coil can be chosen appropriately, dependent on the expected voltages and currents. Their values should be such, that an open circuit condition is safely avoided.

In an aspect of the present application, the fail-safe device may comprise circuitry that may be adapted to interrupt a short circuit between a partial discharge monitoring system 210 and ground potential. In a further aspect of the present application, a circuitry in the fail-safe circuit may comprise a switch, controlled by a control unit 610 or comprising a fuse 720 in FIG. 7, wherein the switch, controlled by the control unit 610, or the fuse 710 are connected between a third monitoring system-terminal (2c) and a ground potential (2) or (2b). In an aspect of the present application, the switch may comprise a relay REL or a semiconductor, e.g. a transistor, a FET, etc.

In the control unit 610, the switch may be an integral part of the fail-safe kit or device 310. The fail-safe device 310 may constructed such, that circuitry to protect against an open circuit failure mode and circuitry against a short circuit are both implemented in one fail-safe kit 310.

Failure mode according to short-circuit to ground is quite unlikely but more difficult to handle and to provide protection against it. This type of failsafe protection is only needed, if the partial discharge monitoring system 210 has potential to fail into a short circuit to ground, that is to say, if the monitoring system is constructed in a way that an electrically connection to ground can be created.

Figure 6:
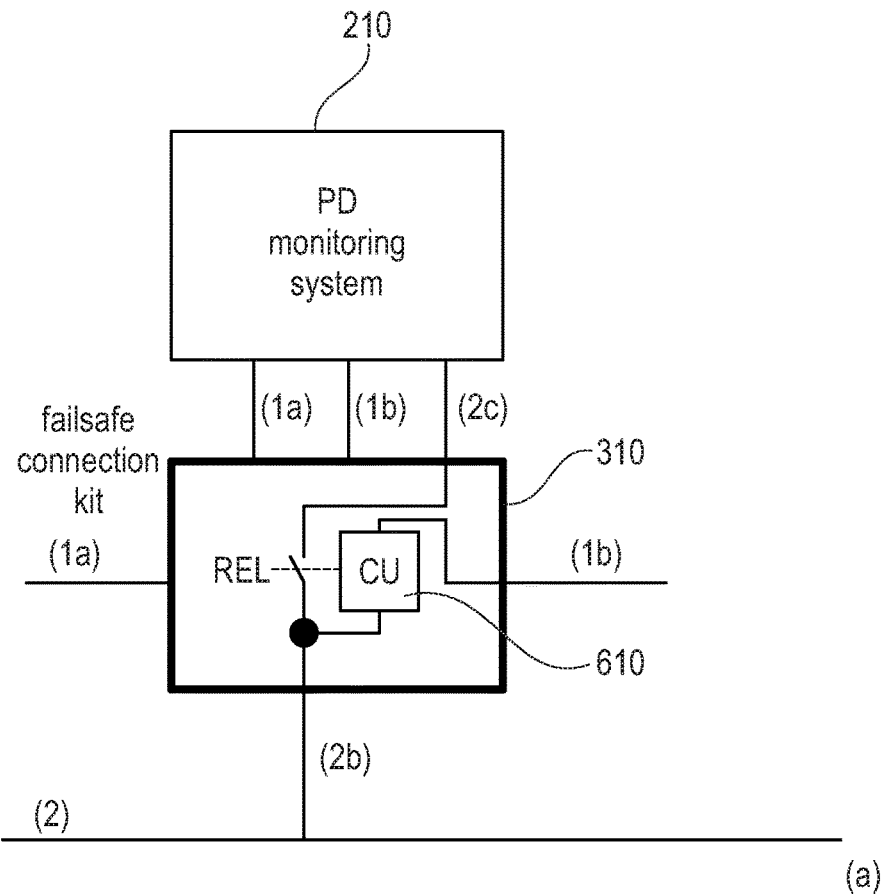
FIG. 6 shows embodiments of circuits in a fail-safe devices according to embodiments of the present disclosure.
Figure 6:
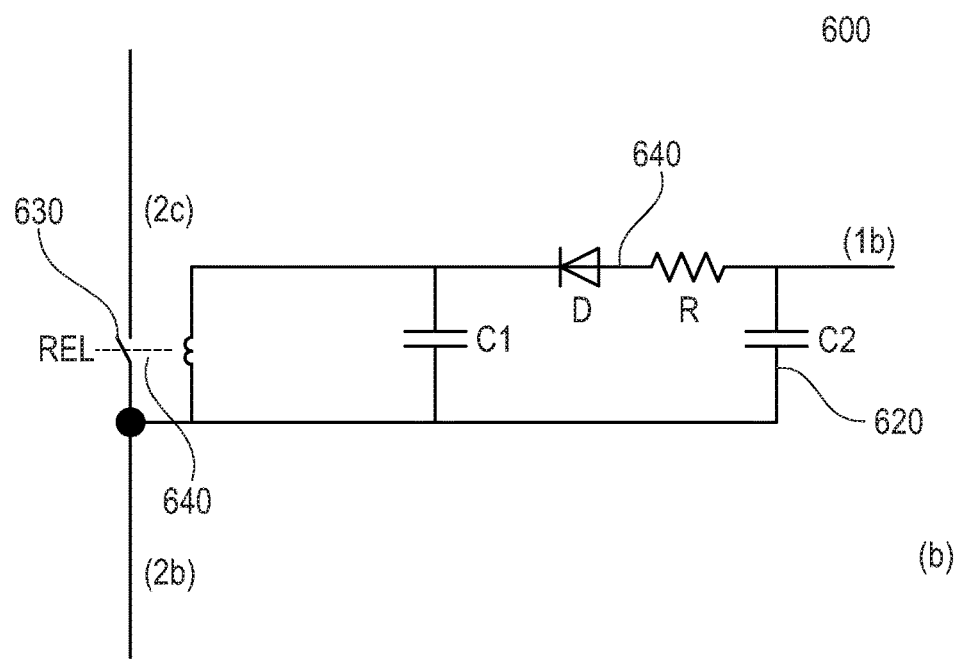

Typically, a solid-state (i.e. based on semiconductors as e.g. transistors) or a mechanical relay may be used to create that path. The former typically fails into a short circuit. E.g. the semiconductor may fail such, that the junction in the semiconductor is permanently conductive. In contrary, the mechanical relay typically fails into an open-circuit. The second failure mode, short-circuit to ground, can therefore be avoided by opening the path to ground, if the voltage across the Voltage-Indicator-System drops below a threshold value for too long. The idea is depicted in FIG. 6a, where a normally open relay 630 (REL) is controlled by a control unit 610 (CU) that monitors the Voltage-Indicator-System 110 voltage, i.e. between (1b) and (2b).

If the Voltage-Indicator-System voltage is too long below a certain value, the control unit has not enough energy to maintain REL 630 closed and the fault is cleared. FIG. 6b depicts a possible embodiment of the control unit: C1 and R are used to store energy and filter out intermittent disconnection of the Voltage-Indicator-System, C2 and R are used to filter high-frequency noise generated by the control unit 610, and D is used to have the right polarity on the control coil L. R is used to render the control unit having a high-impedance. Practical implementation of this scheme is unfortunately challenging, as mechanical relays typically have pretty low coil impedance (e.g. tens of kilo-ohms in the best cases), which may imply the use of specific relays (e.g. based on MEMS, i.e. micro-electro-mechanical switches). Other embodiments are possible. All of them, however, have in common, that the control unit 610 monitors a voltage between (1b) and (2b).

Figure 7:
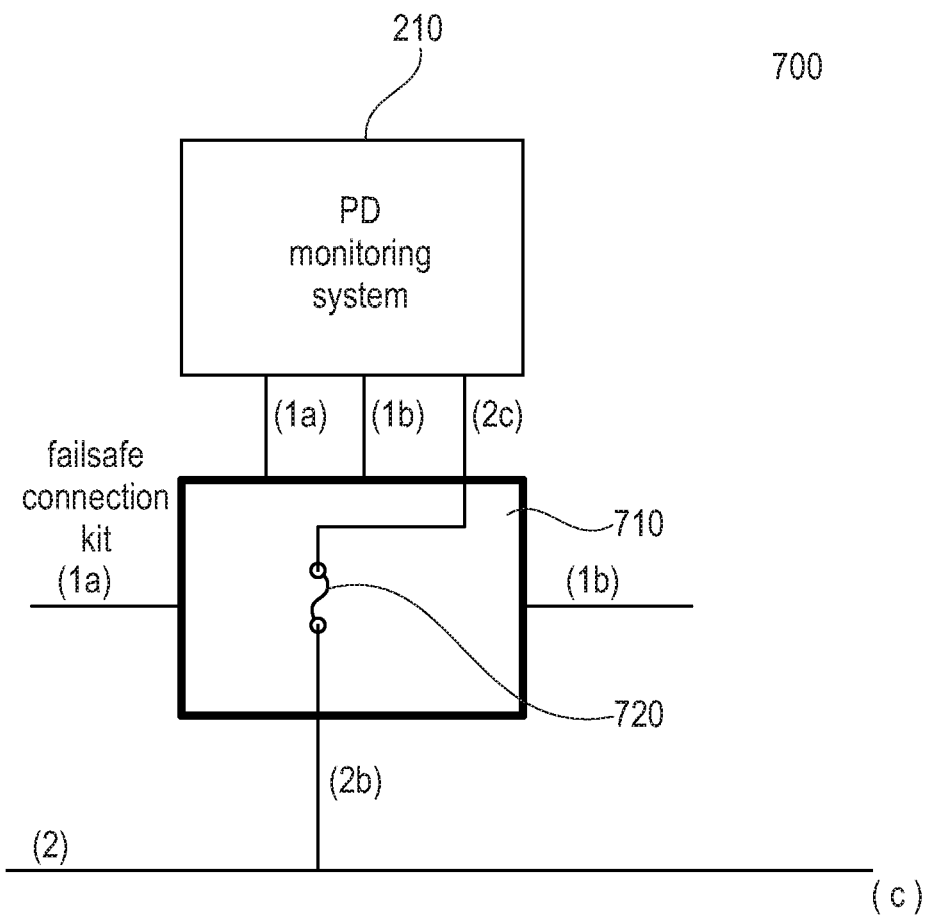
FIG. 7 shows embodiments of a circuit in a fail-safe device according to embodiments of the present disclosure.

An alternative and simpler scheme is depicted in FIG. 7: a fuse F 720 is used to protect subsequent circuit in the partial discharge monitoring system, i.e. there is much higher likelihood that the fuse blows, rather than that the circuit in the partial discharge monitoring system fails in a short-circuit.

In an embodiment of the present application, a monitoring system 210 with a fail-safe device 310 according to described embodiments is disclosed. The fail-safe device 310 may be electrically connected with the monitoring system 210. Monitoring system 210 can be adapted to be electrically connected with a Voltage-Indicator-System 110. Alternatively, failsafe device 310 may be connected with the voltage Indicator system 110 and may form a single unit, as shown in FIG. 3. The unit may have electrical connections for connecting a monitoring system 210.

In a further embodiment of the present application, a Voltage-Indicator-System 110, VIS, with a fail-safe-device according to described embodiments is disclosed. The Voltage-Indicator-System 110 with a failsafe device may have electrical connections, as e.g. additional connections (1a), (1b) and optional (2c), shown in FIG. 3 which are adapted to connect to a monitoring system 210.

That is, e.g. the brown-field Voltage-Indicator-System 110 is maintained, but a "failsafe" connection kit 310, according to embodiments is inserted in the line (1), i.e. in the cable coming from the coupler 130 and going to the Voltage-Indicator-System 110. The failsafe connection kit 310 may provide two functionalities: Ensuring that the electric connection between the coupler and the Voltage-Indicator-System remains functional even in case of absence (or failure) of the partial discharge monitoring system 210, and keeping the voltage level at the failsafe connection point at a low level. In this way, an on-voltage replacement of the partial discharge monitoring system 210 is possible without shutting down the installation.

An embodiment of a disclosed retrofit kit may provide a Voltage-Indicator-System 110 with integrated partial discharge monitoring 210 capabilities. In this case, brown-field Voltage-Indicator-System 110, which means an already installed system, may be fully replaced by new Voltage-Indicator-System 320 or alternatively new switchgears may be pre-equipped with new Voltage-Indicator-Systems so that subsequent retrofit of partial discharge monitoring system 210 on different switchgear on the market can be simplified. Therefore, in a further embodiment of the present application, a Voltage-Indicator-System 110 with a monitoring system 210, preferably with an integrated monitoring system as a unit, according to described embodiments is disclosed.

Figure 4:
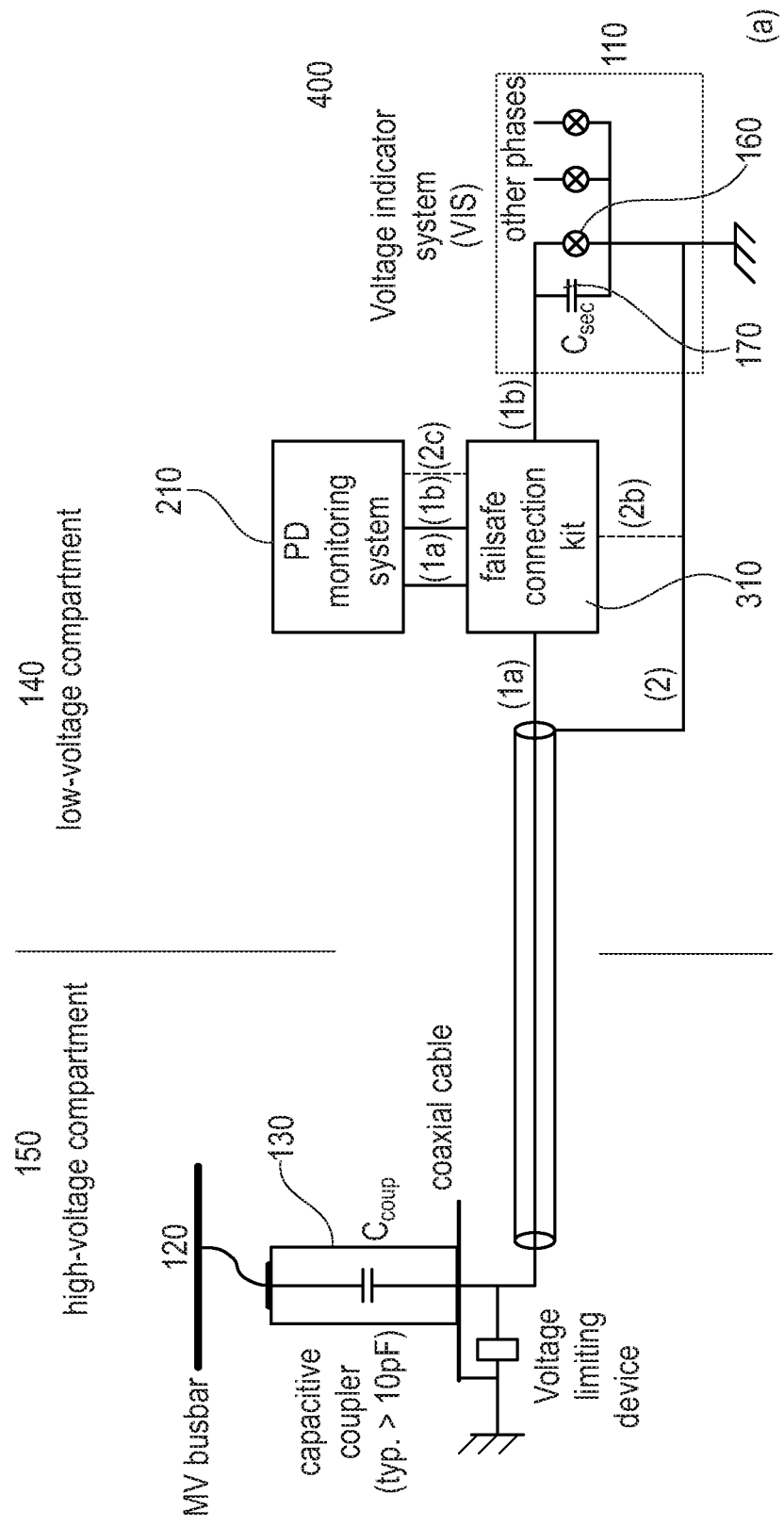
FIG. 4 shows an embodiment of a solution of the present application.

In a further aspect, a brown-field Voltage-Indicator-System is replaced by a (new) partial discharge-friendly Voltage-Indicator-System that contains not only Voltage-Indicator-System lamps 160 as usual, but additionally partial discharge outputs (1a), (1b), (2c) that allow the connection of a partial discharge monitoring system 210. In addition to the usual Voltage-Indicator-System requirements and features, the partial discharge-friendly Voltage-Indicator-System is designed in a way, that it does not produce noise that disturbs partial discharge measurements and allows in addition for hot swap of the partial discharge monitoring system. In other words, the second solution instance combines the key features of the first solution instance with a Voltage-Indicator-System that is noiseless with respect to partial discharge measurement (e.g. with the introduction of adequate filtering or the use of lamps that does not present noise to start with). As it is a straightforward variation of the first solution instance, the second solution instance is not discussed further in this document (but remains an important solution instance). In a first solution instance (keeping the brown-field Voltage-Indicator-System) is sketched in FIG. 4, while the second instance (replacing the brown-field Voltage-Indicator-System) is sketched in FIG. 3.

Therefore, the failsafe kit 310 according to one or more previously disclosed aspects is provided. A monitoring system 210 with a failsafe device or kit 310 is provided. Both can form an integrated unit. A voltage indicator system 110 with the failsafe device or kit 310 according to one or more previously disclosed aspects is provided. Both can form an integrated unit.

A voltage indicator system 110 with integrated monitoring system 210 and failsafe device or kit 310 according to one or more previously disclosed aspects is provided. Voltage indicator system 110, monitoring system 210 and failsafe device or kit 310 can form an integrated unit.

In yet another aspect of the present invention, the fail-safe kit according to one or more embodiments, may further comprise a network interface for connecting the device to a data network, in particular a global data network. The data network may employ communication protocols e.g., but not limited to, TCP/IP network as used in internet communication. The device may be operatively connected to the network interface for carrying out commands received from the data network. The commands may include a control command for controlling the device to carry out a task such as transmitting stored data, e.g. data from partial discharge events. The device or system may be adapted to be remote-controlled via the network interface. The control path may be a bidirectional control-path. A full control of the device or system via the network interface may be provided.

In this case, the device/controller is adapted for carrying out the task in response to the control command. The commands may include a status request. In response to the status request, or without prior status request, the device/controller may be adapted for sending a status information to the network interface, and the network interface is then adapted for sending the status information over the network. The commands may include an update command including update data. In this case, the device/controller is adapted for initiating an update in response to the update command and using the update data. Other wire-based or wireless transmission techniques (BT, WLAN etc. . . . ) may be used to transmit data. The data network may comprise distributed storage units such as Cloud. Depending on the application, the Cloud can be in form of public, private, hybrid or community Cloud.

In the above, a retrofit fail safe kit 310 for installing a partial discharge monitoring system 210 to an existing voltage indicator system 110 in a switchgear is disclosed. Optionally, the components of the device/kit may be adapted to transmit measured data over a network connection. The device can be remote-controlled via the connection. The retrofit kit has failsafe mechanisms against two types of failure modes of a monitoring system, namely open-circuit and short-circuit.

The fail-safe kit as disclosed advantageously allows for a hot swap of the partial discharge monitoring system. This hot swap is intrinsically supported, if the fail-safe connection kit implements the open-circuit failsafe mechanism presented in FIG. 5. If the partial discharge monitoring system 210 is disconnected, the voltage on line (1) may not exceed the normal voltage across the Voltage-Indicator-System 110. Connector systems which are used between the partial discharge monitoring system 210 and the failsafe connection kit 510 should be voltage and safety rated accordingly. Additionally, the partial discharge monitoring system 210 has in-built circuitry that is adapted to limit an inrush current in order to avoid electrical damages due to discharges. Safety aspect can be improved by ensuring that the last electrical connection to be disconnected is the ground connection.

A further advantageous aspect of the failsafe connection kit may provide a safer replacement of the partial discharge monitoring system. This aspect consists of the possibility to electrically bridge together connections (2b) and (1a). This can be provided via enabling a direct connection by the service personnel or by a mechanical switch. Once those two connections have been bridged, the voltage on the signals between the partial discharge monitoring system and the failsafe connection kit will be at the same potential as that on connection (2), i.e. on ground potential.

The mechanical switch solution can be further part of a scheme where the connection between (1a) to (2) is bridged as soon as the partial discharge monitoring system is disconnected, e.g. an insert, a part of an isolating material, from partial discharge monitoring system 210 side holds this bridge disconnected when connected. In this case, a special circuitry in form of a plug can simulate the partial discharge monitoring system in order to enable the function of the Voltage-Indicator-System in the absence of partial discharge monitoring system "Dummy PD monitoring system".

The previously disclosed aspects and features avoid malfunction of a Voltage-Indicator-System due to failures of a partial discharge monitoring system and allow to easily replace (i.e. without plant shutdown and without the need of new cabling) the partial discharge monitoring system in case of failure. A method is presented, which allows retrofitting a partial discharge monitoring system on medium or high voltage switch gear that is still under voltage.

Connection points (1) to (2) have to be bridged together. This can be provided in the form of a temporary grounding cable whose one end is first safely connected to the ground of the low-voltage compartment, i.e. (2), and whose other end is able to puncture (in a safe way, similar to IDC technique [Insulation Displacement] or other methods) the isolation of (1) to electrically connect (1) and (2). Once this is done for all three electrical phases in the installation, the Voltage-Indicator-System 110 can be safely disconnected and the failsafe connection kit can be installed as usual. Finally, the temporary grounding cable is removed.

The previously disclosed application generally proposes and provides solutions for two related problems. Additionally, the present application provides a method, based on these solutions, that (principally) allows for retrofitting the partial discharge monitoring system without shutting the plant down.

The invention claimed is:

1. A fail-safe device for ensuring reliable operation of a Voltage Indicator System (VIS) for a medium-voltage or high-voltage apparatus in presence of a partial discharge monitoring system comprising:
   a first fail-safe device terminal and a second fail-safe device terminal;
   the first fail-safe device terminal adapted to be connected to an output terminal of a capacitive coupler, the capacitive coupler being provided in a medium-voltage or high-voltage portion of the medium-voltage or high-voltage apparatus, and
   the second fail-safe device terminal adapted to be connected to an input terminal of the Voltage Indicator System, which is provided in a low-voltage portion, wherein the Voltage Indicator System visualizes a presence of high-voltage with a lamp;
   a third fail-safe device terminal and a fourth fail-safe device terminal,
   wherein the third and fourth fail-safe device terminals are adapted to be electrically connected to first and second input/output terminals of the partial discharge monitoring system;
   an electrical circuit, connecting the first fail-safe device terminal and the second fail-safe device terminal and being adapted to compensate for electrical failure modes of the monitoring system such, that the Voltage Indicator System (VIS) is operable in case the electrical failure modes occur.

2. The fail-safe device according to claim 1, wherein the failure modes are an open circuit between said first and second fail-safe device terminals and/or a short circuit between the monitoring system and a ground potential.

3. The fail-safe device according to claim 2, comprising circuitry adapted to interrupt the short circuit between the partial discharge monitoring system and the ground potential.

4. The fail-safe device according to claim 3, wherein the circuitry comprises a switch controlled by a control unit or comprises a fuse, wherein the switch controlled by the control unit or the fuse are connected between a third monitoring system-terminal and a ground potential.

5. The fail-safe device according to claim 4, wherein the switch comprises a relay or a semiconductor.

6. The fail-safe device according to claim 1, wherein an electrical connection between the first fail-safe device terminal and the second fail-safe device terminal provided by the electrical circuit is configured such, that the monitoring system can measure a partial discharge in a voltage drop over the electrical connection.

7. The fail-safe device according to claim 6, wherein the electrical connection provided by the electrical circuit comprises one or more semiconductors, electrically connecting the first fail-safe device terminal and the second fail-safe device terminal, to ensure a current flowing between the first fail-safe device terminal and the second fail-safe device terminal in case the monitoring system is in an open-circuit condition.

8. The fail-safe device according to claim 7, wherein the one or more semiconductors comprise at least one diode.

9. The fail-safe device according to claim 6, wherein the electrical connection provided by the electrical circuit comprises a resistor and/or a coil.

10. The fail-safe device according to claim 6, wherein the electrical connection provided by the electrical circuit comprises a wire connection, electrically connecting the first fail-safe device terminal and the second fail-safe device terminal, to ensure a current flowing between the first fail-safe device terminal and the second fail-safe device terminal in case an electrical pulse monitoring system is in an open-circuit condition.

11. The fail-safe device according to claim 1, wherein an electrical connection between the first fail-safe device terminal and the second fail-safe device terminal provided by the electrical circuit is configured such, that a property can be measured as a voltage drop over the electrical connection.

12. The fail-safe device according to claim 11, wherein the property is in a different frequency range than a line frequency.

13. The fail-safe device according to claim 12, wherein the electrical connection provided by the electrical circuit comprises a resistor and/or a coil.

14. The fail-safe device according to claim 11, wherein the electrical connection provided by the electrical circuit comprises one or more semiconductors, electrically connecting the first fail-safe device terminal and the second fail-safe device terminal, to ensure a current flowing between the first fail-safe device terminal and the second fail-safe device terminal in case the monitoring system is in an open-circuit condition.

15. The fail-safe device according to claim 11, wherein the electrical connection provided by the electrical circuit comprises a resistor and/or a coil.

16. The fail-safe device according to claim 11, wherein the electrical connection provided by the electrical circuit comprises a wire connection, electrically connecting the first fail-safe device terminal and the second fail-safe device terminal, to ensure a current flowing between the first fail-safe device terminal and the second fail-safe device terminal in case an electrical pulse monitoring system is in an open-circuit condition.

17. A monitoring system with a fail-safe device according to claim 1, wherein the fail-safe device is electrically connected with the monitoring system, and the monitoring system is electrically connected with the Voltage Indicator System (VIS).

18. A device or a system according to claim 17, wherein the monitoring system is the partial-discharge monitoring system.

19. A device or a system according to claim 1, further comprising:
   a network interface for connecting the device to a data network,
   wherein the device or system is operatively connected to the network interface for at least one of carrying out a command received from the data network and sending device status information to the data network, and wherein the device or system further comprises a processing unit, adapted to convert signals and data generated by the device or system into a digital signal.

\* \* \* \* \*